(12) United States Patent
Schwab et al.

(10) Patent No.: US 6,335,619 B1
(45) Date of Patent: Jan. 1, 2002

(54) INDUCTIVE PROXIMITY SENSOR COMPRISING A RESONANT OSCILLATORY CIRCUIT RESPONDING TO CHANGES IN INDUCTIVE REACTION

(75) Inventors: Michel Schwab, Bienne; Xuan Mai Tu, Ecublens, both of (CH)

(73) Assignee: Detra SA, Bienne (CH)

( * ) Notice: Subject to any disclaimer, the term of this patent is extended or adjusted under 35 U.S.C. 154(b) by 0 days.

(21) Appl. No.: 09/485,565

(22) PCT Filed: Aug. 22, 1997

(86) PCT No.: PCT/CH97/00312

§ 371 Date: Feb. 14, 2000

§ 102(e) Date: Feb. 14, 2000

(87) PCT Pub. No.: WO99/10981

PCT Pub. Date: Mar. 4, 1999

(51) Int. Cl.[7] ....................................................... G01B 7/14
(52) U.S. Cl. ................. 324/207.26; 324/207.12; 324/207.16
(58) Field of Search ............... 324/207.12, 207.15, 324/207.16, 207.17, 207.26, 234, 1, 240, 329, 336; 340/551, 686.1, 686.6

(56) References Cited

U.S. PATENT DOCUMENTS

| 4,942,372 A | | 7/1990 | Heimlicher ...................... 331/65 |
| 5,498,958 A | * | 3/1996 | Tu et al. .................. 324/207.16 |

FOREIGN PATENT DOCUMENTS

| CH | 655 414 A5 | 4/1986 |
| DE | 32 25 193 A1 | 1/1984 |
| DE | 33 12 756 A1 | 10/1984 |
| DE | 39 19 916 A1 | 12/1990 |
| DE | 40 32 001 A1 | 5/1992 |

* cited by examiner

Primary Examiner—Jay M. Patidar
(74) Attorney, Agent, or Firm—Oliff & Berridge, PLC

(57) ABSTRACT

An inductive proximity sensor that uses a resonant oscillatory circuit to detect a target by changes to inductive reaction. The oscillating circuit has primary and secondary windings where a capacitor and load resistance are connected in parallel with the primary winding, the value of the load resistance is selected so that in a state of oscillation the ohmic losses in the load resistance are substantially higher than the ohmic losses in the primary winding, and the primary and secondary windings are disposed so that the mutual flux between the primary and secondary windings is substantially less than the particular flux of each winding.

7 Claims, 4 Drawing Sheets

INDUCTIVE PROXIMITY SENSOR COMPRISING A RESONANT OSCILLATORY CIRCUIT RESPONDING TO CHANGES IN INDUCTIVE REACTION

CROSS-REFERENCES TO RELATED APPLICATIONS

U.S. National Stage patent application under 35 U.S.C. §371 and 37 C.F.R. §1.494 of PCT/CH97/00312 filed Aug. 22, 1997.

BACKGROUND OF THE INVENTION

1. Field of Invention

The invention relates to an inductive proximity sensor comprising a resonant circuit including two coupled windings.

2. Description of Related Art

Inductive proximity sensors using a resonant circuit are known. See for example U.S. Pat. No. 4,942,372 These sensors function according to the following principle: in the absence of a metallic object near the sensor, the measuring circuit, being constituted by an oscillator inducing resonance, oscillates with a certain amplitude which depends on the own loss of the oscillator (ohmic losses in the circuit's coil, hysteresis losses in the magnetic circuit of the coil). The proximity of a metallic object causes losses by eddy currents induced in this object and consequently a diminution of the amplitude of oscillation. The comparison of this amplitude with a reference value makes it possible to detect the presence of metallic objects.

The principal disadvantage of this type of sensor resides in the sensitivity to the own losses of the resonant circuit.

When the temperature varies, the own losses of the circuit vary and cause a modification of the amplitude of oscillation.

To assess this temperature dependency, there exist methods using two magnetically coupled coils, such as, the methods described in patents DE 40 32 001 C2 and CH 655 414 A5. However, the implementation of these methods is rather complex.

SUMMARY OF THE INVENTION

It is the purpose of this invention to propose a new type of sensor easy to implement and making it possible to remedy the aforementioned disadvantages.

BRIEF DESCRIPTION OF THE DRAWINGS

The invention will be described in detail in the following description making reference to the attached drawings in which.

DETAILED DESCRIPTION OF PREFERRED EMBODIMENTS

Figure 1:
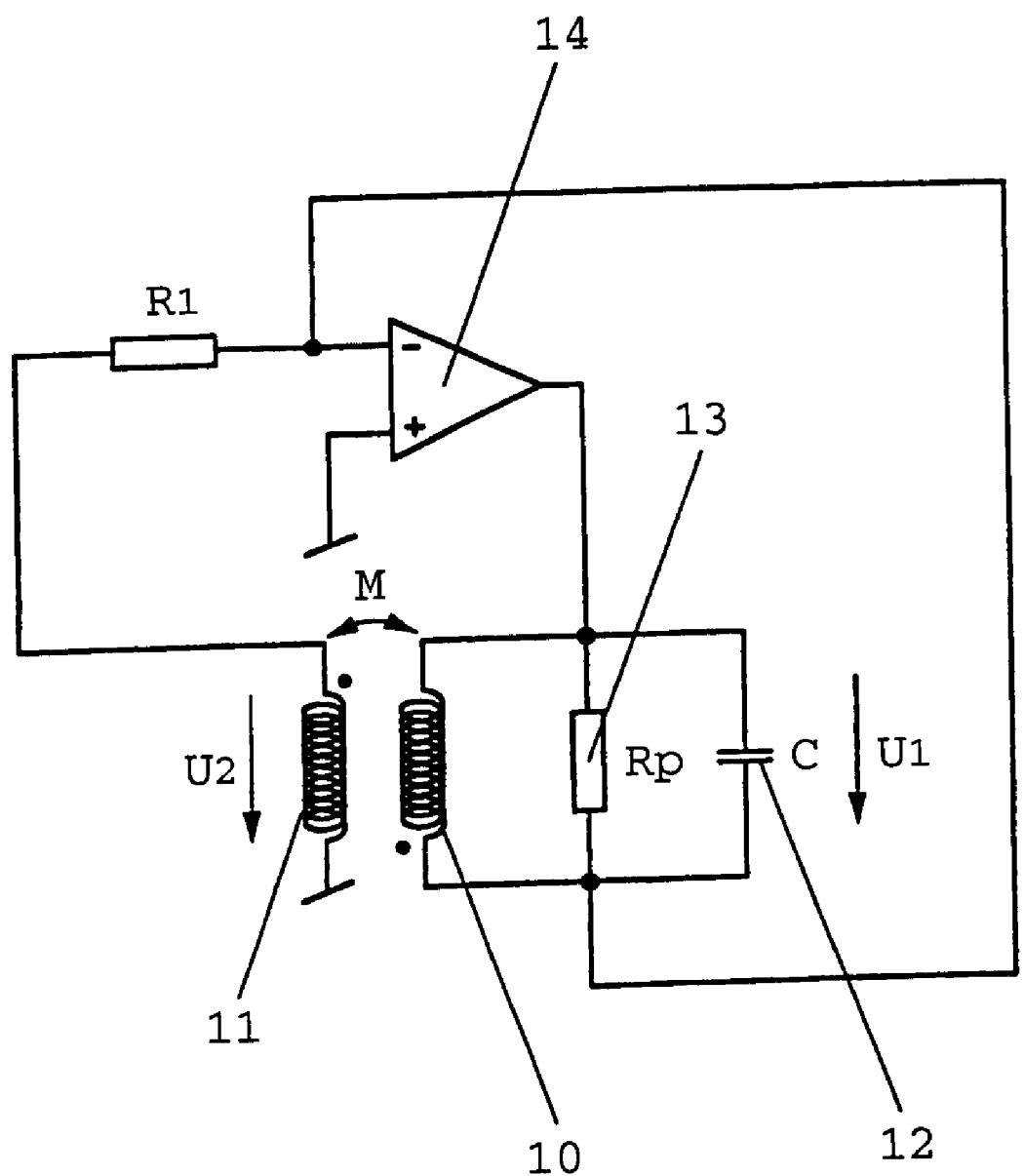
FIG. 1 shows a diagram of an oscillator with inductive reaction of the related art.

FIG. 1 shows a diagram of an oscillator with inductive reaction. This oscillator comprises a primary winding 10, at whose terminals the capacitor 12 is set in parallel, the resistance $R_p$ representing the total loss resistance of the oscillator including the ohmic losses, the hysteresis losses and the losses by eddy currents in the case where a target is near. A secondary winding 11 is coupled with the primary winding 10, the coupling between both windings being represented symbolically by the mutual inductance M. A terminal of the secondary winding 11 is grounded, the other is connected to the input resistance $R_1$ of the amplifier 14. Without the inductive reaction, the amplifier's gain is given by $g=-R_p/R_1$. The ratio of the primary and secondary voltage under the effect of the inductive coupling is $k=U_2/U_1$. The condition of oscillation is given by:

$$g \cdot k \geq 1.$$

At constant temperature, in the absence of the target, if $R_1$ is chosen so that $g \cdot k$ is slightly greater than 1, the oscillation is established.

If a metallic target 41 is brought near the primary winding, under the effect of the losses by eddy currents in the target, the resistance $R_p$ decreases, which causes the oscillations to stop.

Since $R_p$ also depends on the ohmic losses and the hysteresis losses, it is easily understood that the functioning of a sensor using this circuit is not certain, unless the losses by eddy currents are much higher than the circuit's particular losses. In this case, the target must be very close to the sensor; in other words, the sensor has a very low sensitivity.

Figure 2:
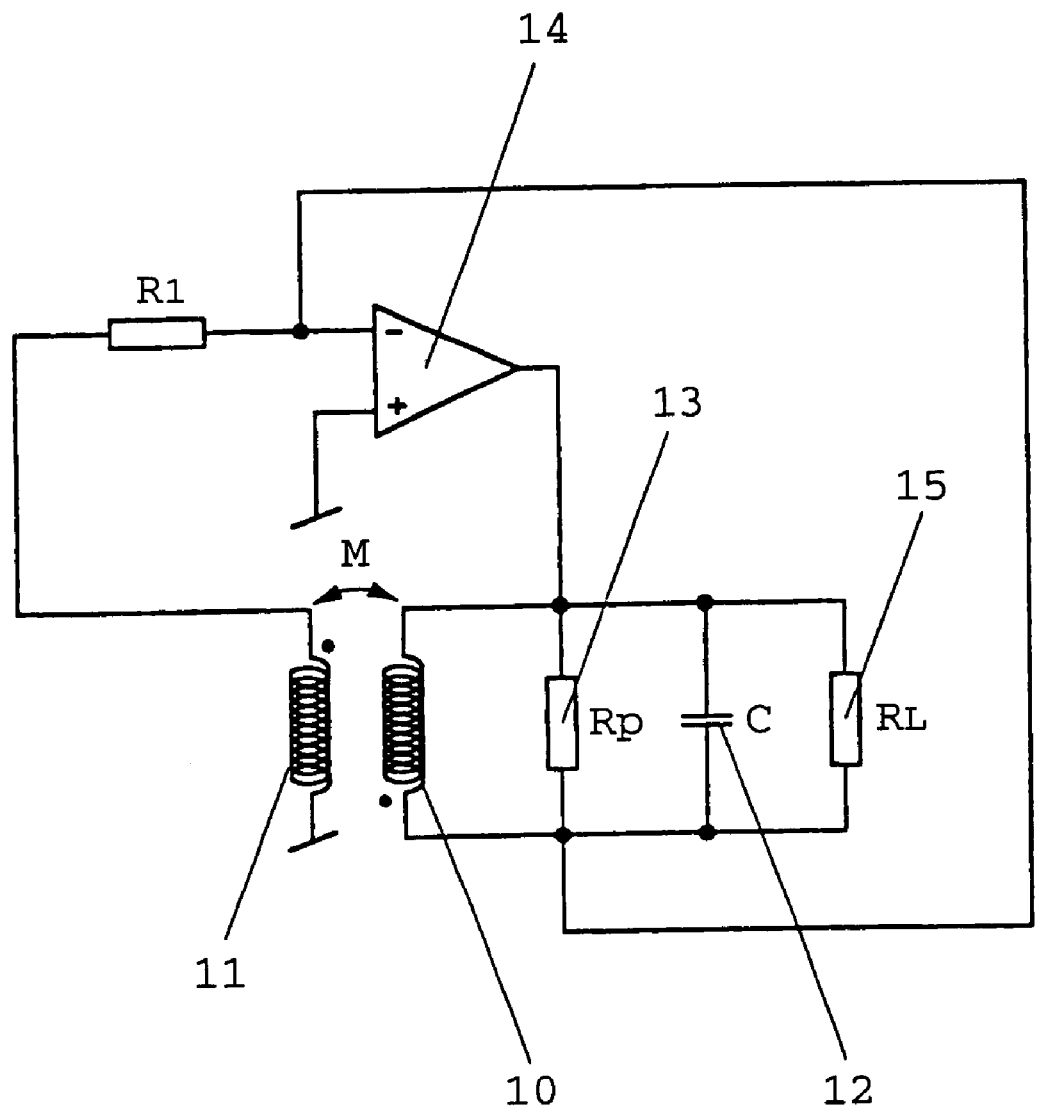
FIG. 2 shows a diagram of one exemplary embodiment of an oscillator according to this invention.

To remedy this disadvantage, the invention proposes the circuit of FIG. 2. In this circuit, a load resistance $R_L$ is added, whose value is substantially less than the resistance $R_p$ in the absence of the target. Thus, when $R_p$ varies according to the temperature, the equivalent resistance given by the paralleling of $R_L$ and $R_p$ remains practically constant.

However, by doing so, without taking any precautions as far as the arrangement of the primary and secondary windings are concerned, the sensor becomes practically insensitive since the product $g \cdot k$ remains practically constant.

Figure 3:
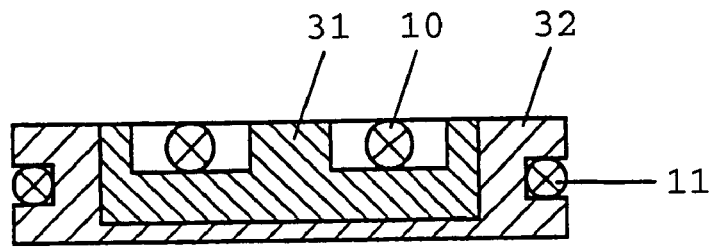
FIG. 3 shows a first example of an arrangement of primary and secondary windings, according to this invention.

FIG. 3 shows a first example of an arrangement of the primary and secondary windings according to the invention. The primary winding 10 comprises a coil placed in a pot of ferrite 31. The latter is disposed in a cage of insulating material 32 which also functions as a coil frame of the secondary winding 11.

Figure 4:
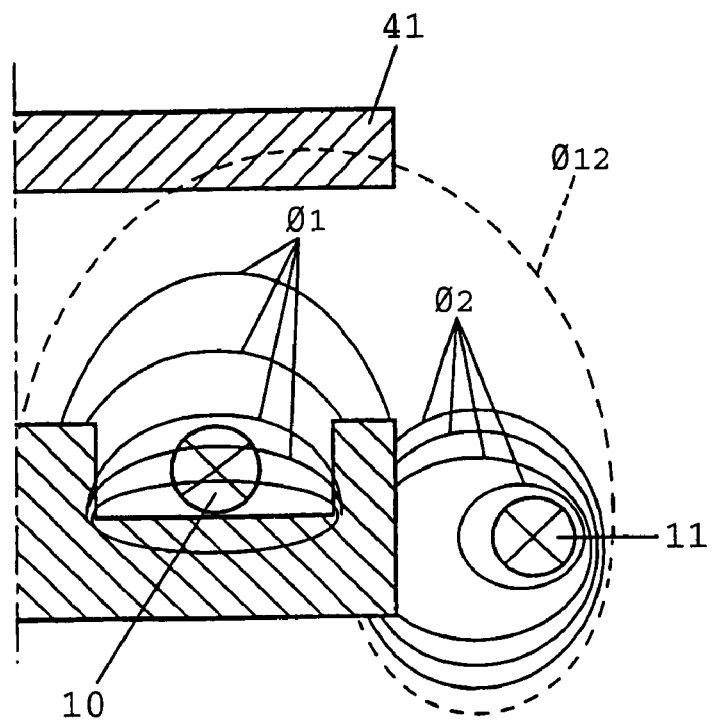
FIG. 4 shows the particular and the mutual flux of the windings of FIG. 3.

FIG. 4 shows the particular and the mutual flux of the primary and secondary windings of FIG. 3. By this arrangement, the particular flux $Ø_1$ of the primary winding (flux coupled only with the primary winding) as well as the particular flux $Ø_2$ of the secondary winding are substantially greater than the mutual flux $Ø_{12}$ between both windings. An approaching metallic target 41 causes a substantial diminution of the coupling flux $Ø_{12}$ between both windings, and thus, of the factor k. Under these conditions, the oscillator of FIG. 2 stops oscillating at the approach of a target since the product $g \cdot k$ is less than 1.

Figure 5:
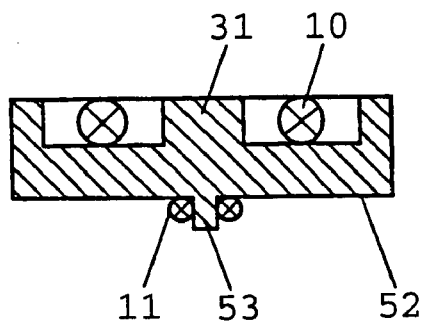
FIG. 5 shows a second example of an arrangement of primary and secondary windings, according to this invention.

FIG. 5 shows a second example of an arrangement of the primary and secondary windings according to the invention. The primary winding 10 comprises a coil placed in a pot of ferrite 31. On the rear side 52 (opposite the side exposed to the target), the secondary winding 11 is coiled around a rod of ferrite 53 placed along the axis of the pot of ferrite 51.

Figure 6:
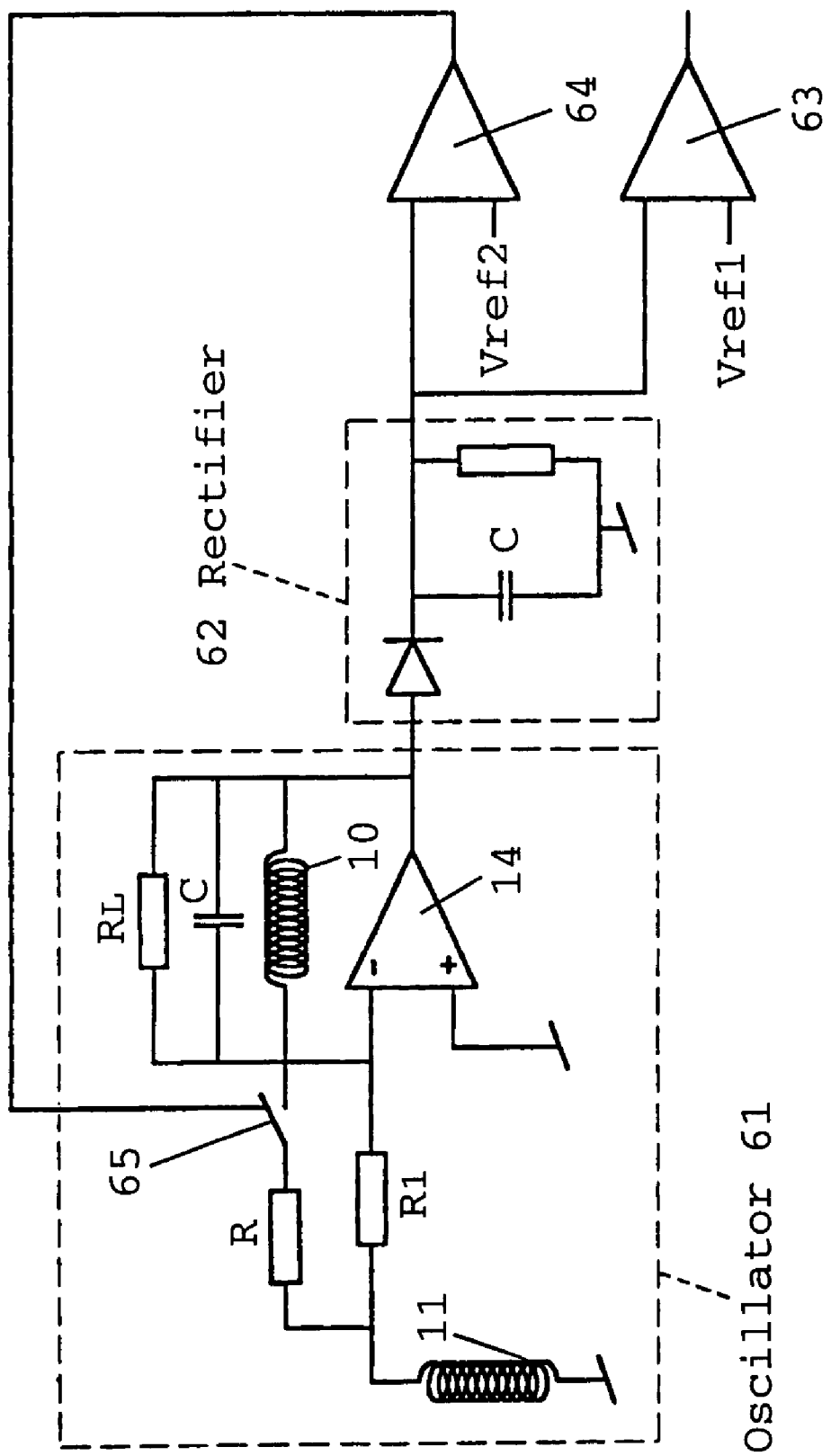
FIG. 6 represents an exemplary embodiment of the implementation of a sensor, according to this invention.

FIG. 6 represents an embodiment of the sensor according to the invention. This sensor comprises an oscillator 61, a rectifier 62, a first comparator 63 with a reference voltage $V_{ref1}$ indicating the presence of the target to be detected when its input voltage is lower than $V_{ref1}$, a second comparator 64 with a reference voltage $V_{ref2} < V_{ref1}$. The output of this comparator acts on the switch 65 which enables the gain of amplifier 14 to increase when the amplitude is lower than $V_{ref2}$. This circuit allows the oscillation to be retained below this voltage. In this manner, it is possible to improve the switching frequency of the sensor.

What is claimed is:

1. An inductive proximity sensor for detecting a target having an oscillatory circuit with inductive reaction, the sensor comprising:

an amplifier, a primary winding connected to a first terminal of said amplifier, a secondary winding connected to a second terminal of said amplifier, a capacitor connected in parallel with said primary winding, a load resistance, connected in parallel with said primary winding, wherein the value of said load resistance is selected, so that in a state of oscillation, the ohmic losses in this load resistance are substantially higher than the ohmic losses in the primary winding; and the primary winding and the secondary winding are disposed so that the mutual flux between the primary and secondary windings is substantially less than the particular flux of each winding.

2. The inductive proximity sensor according the claim 1, wherein said first terminal is an output terminal of the amplifier and said second terminal is an input terminal of the amplifier.

3. The inductive proximity sensor according to claim 1, wherein said first terminal is an input terminal of the amplifier and said second terminal is an output terminal of the amplifier.

4. The inductive proximity sensor according to claim 1, wherein said primary winding comprises a first coil placed in a ferrite pot, the secondary winding being constituted by a second coil placed outside said pot of ferrite, the first and second coils being coaxial and said second coil being disposed within a width of a coil frame holding said second coil.

5. The inductive proximity sensor according to claim 4, wherein said second coil is disposed on the coil frame made of insulating material that is disposed around the pot of ferrite containing the first coil.

6. The inductive proximity sensor according to claim 1, wherein said primary winding comprises a first coil placed in a ferrite pot having a front side and a rear side, the secondary winding being constituted by a second coil placed around a rod of ferrite disposed on said rear side of said ferrite pot, the front side of the pot being the side closest to the target to be detected.

7. The inductive proximity sensor according to claim 1, further comprising:

a rectifier circuit;

a first comparator comprising a first input supplied with a reference voltage $V_{ref1}$; and a second comparator comprising a first input supplied with a reference voltage $V_{ref2}$, $V_{ref2}$ being $< V_{ref1}$, wherein an output of said second comparator is connected to a switch acting on the gain of the amplifier and an output signal of said first comparator indicates the presence or absence of a target.

* * * * *